(12) United States Patent
Benjamin

(10) Patent No.: US 9,105,449 B2
(45) Date of Patent: Aug. 11, 2015

(54) DISTRIBUTED POWER ARRANGEMENTS FOR LOCALIZING POWER DELIVERY

(75) Inventor: Neil Benjamin, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 1224 days.

(21) Appl. No.: 12/145,389

(22) Filed: Jun. 24, 2008

(65) Prior Publication Data

US 2009/0081811 A1 Mar. 26, 2009

Related U.S. Application Data

(60) Provisional application No. 60/947,378, filed on Jun. 29, 2007.

(51) Int. Cl.
| | |
|---|---|
| C23C 16/00 | (2006.01) |
| C23F 1/00 | (2006.01) |
| H01L 21/306 | (2006.01) |
| H01J 37/32 | (2006.01) |

(52) U.S. Cl.
CPC ............................. *H01J 37/32045* (2013.01)

(58) Field of Classification Search
USPC ................ 118/715, 722, 723 R, 723 E, 723 I; 156/345.43, 345.44, 345.45, 345.46, 156/345.47, 345.48; 315/111.21
See application file for complete search history.

(56) References Cited

U.S. PATENT DOCUMENTS

| | | |
|---|---|---|
| 4,579,618 A | 4/1986 | Celestino et al. |
| 4,590,042 A | 5/1986 | Drage |
| 4,793,975 A | 12/1988 | Drage |
| 5,380,396 A | 1/1995 | Shikida et al. |
| 5,397,962 A | 3/1995 | Moslehi |
| 5,422,139 A | 6/1995 | Fischer |
| 5,522,934 A | 6/1996 | Suzuki et al. |
| 5,531,834 A | 7/1996 | Ishizuka et al. |
| 5,683,548 A | 11/1997 | Hartig et al. |
| 5,716,451 A | 2/1998 | Hama et al. |
| 6,137,231 A | 10/2000 | Anders et al. |
| 6,143,129 A | 11/2000 | Savas et al. |
| 6,155,199 A | 12/2000 | Chen et al. |

(Continued)

FOREIGN PATENT DOCUMENTS

| | | |
|---|---|---|
| JP | 406037052 | 2/1994 |
| JP | 2000-269146 A | 9/2000 |

(Continued)

OTHER PUBLICATIONS

"International Search Report", Issued in PCT Application No. PCT/US2008/068150; Mailing Date: Oct. 31, 2008.

(Continued)

*Primary Examiner* — Maureen Gramaglia
(74) *Attorney, Agent, or Firm* — Martine Penilla Group, LLP

(57) ABSTRACT

A distributed power arrangement to provide local power delivery in a plasma processing system during substrate processing is provided. The distributed power arrangement includes a set of direct current (DC) power supply units. The distributed power arrangement also includes a plurality of power generators, which is configured to receive power from the set of DC power supply units. Each power generator of the plurality of power generators is coupled to a set of electrical elements, thereby enabling the each power generator of the plurality of power generators to control the local power delivery.

23 Claims, 11 Drawing Sheets

(56) References Cited

U.S. PATENT DOCUMENTS

| | | | |
|---|---|---|---|
| 6,156,667 A | 12/2000 | Jewett | |
| 6,158,384 A | 12/2000 | Ye et al. | |
| 6,189,485 B1 | 2/2001 | Matsuda et al. | |
| 6,203,620 B1 | 3/2001 | Moslehi | |
| 6,204,607 B1 | 3/2001 | Ellingboe | |
| 6,209,480 B1 | 4/2001 | Moslehi | |
| 6,245,396 B1 | 6/2001 | Nogami | |
| 6,392,210 B1 | 5/2002 | Jewett et al. | |
| 6,411,490 B2 * | 6/2002 | Dible | 361/234 |
| 6,427,623 B2 | 8/2002 | Ko | |
| 6,469,919 B1 | 10/2002 | Bennett | |
| 6,471,779 B1 | 10/2002 | Nishio et al. | |
| 6,506,686 B2 | 1/2003 | Masuda et al. | |
| 6,511,577 B1 | 1/2003 | Johnson | |
| 6,537,418 B1 | 3/2003 | Muller et al. | |
| 6,578,515 B2 | 6/2003 | Sakamoto et al. | |
| 6,618,276 B2 | 9/2003 | Bennett | |
| 6,632,324 B2 | 10/2003 | Chan | |
| 6,764,658 B2 | 7/2004 | Denes et al. | |
| 6,821,563 B2 | 11/2004 | Yudovsky | |
| 6,821,910 B2 | 11/2004 | Adomaitis et al. | |
| 6,890,386 B2 | 5/2005 | DeDontney et al. | |
| 6,892,669 B2 | 5/2005 | Xu et al. | |
| 6,983,892 B2 | 1/2006 | Noorbakhsh et al. | |
| 7,115,184 B2 | 10/2006 | Ohmi et al. | |
| 7,166,233 B2 | 1/2007 | Johnson et al. | |
| 7,452,827 B2 | 11/2008 | Gianoulakis et al. | |
| 7,540,923 B2 | 6/2009 | Takagi et al. | |
| 7,543,546 B2 | 6/2009 | Shibata et al. | |
| 7,819,081 B2 | 10/2010 | Kawasaki et al. | |
| 7,976,631 B2 | 7/2011 | Burrows et al. | |
| 7,976,674 B2 | 7/2011 | Brcka | |
| 8,105,440 B2 | 1/2012 | Nogami | |
| 2001/0006093 A1 | 7/2001 | Tabuchi et al. | |
| 2001/0047760 A1 | 12/2001 | Moslehi | |
| 2002/0046989 A1 | 4/2002 | Blonigan et al. | |
| 2003/0052085 A1 * | 3/2003 | Parsons | 216/60 |
| 2003/0057847 A1 | 3/2003 | Strang | |
| 2003/0106643 A1 | 6/2003 | Tabuchi et al. | |
| 2003/0129107 A1 | 7/2003 | Denes et al. | |
| 2004/0026040 A1 | 2/2004 | Kurihara et al. | |
| 2004/0165324 A1 * | 8/2004 | Wiedemuth et al. | 361/18 |
| 2004/0208804 A1 | 10/2004 | Hall et al. | |
| 2004/0216668 A1 | 11/2004 | Lindfors et al. | |
| 2005/0014382 A1 | 1/2005 | Lee et al. | |
| 2005/0016457 A1 | 1/2005 | Kawasaki et al. | |
| 2005/0126487 A1 | 6/2005 | Tabuchi et al. | |
| 2005/0257891 A1 | 11/2005 | Goto et al. | |
| 2005/0272261 A1 | 12/2005 | Mashima et al. | |
| 2006/0057854 A1 * | 3/2006 | Setsuhara et al. | 438/710 |
| 2006/0234514 A1 | 10/2006 | Gianoulakis et al. | |
| 2007/0110918 A1 | 5/2007 | Yuda et al. | |
| 2007/0145900 A1 * | 6/2007 | Kirchmeier et al. | 315/111.21 |
| 2008/0050292 A1 | 2/2008 | Godyak | |
| 2009/0078677 A1 | 3/2009 | Benjamin | |
| 2009/0236041 A1 | 9/2009 | Iizuka | |

FOREIGN PATENT DOCUMENTS

| | | | |
|---|---|---|---|
| JP | 2005-158980 | 6/2005 | H01L 21/205 |
| JP | 2006/203199 A | 8/2006 | |
| JP | 2006-203199 A | 8/2006 | |

OTHER PUBLICATIONS

"Written Opinion", Issued in PCT Application No. PCT/US2008/068150; Mailing Date: Oct. 31, 2008.

"International Search Report", Issued in PCT Application No. PCT/US2008/068144; Mailing Date: Dec. 29, 2008.

"Written Opinion", Issued in PCT Application No. PCT/US2008/068144; Mailing Date: Dec. 29, 2008.

"International Search Report", Issued in PCT Application No. PCT/US2008/068154; Mailing Date: Dec. 29, 2008.

"Written Opinion", Issued in PCT Application No. PCT/US2008/068154; Mailing Date: Dec. 29, 2008.

"International Preliminary Report on Patentability", Issued in PCT Application No. PCT/US2008/068144; Mailing Date: Jan. 14, 2010.

"International Preliminary Report on Patentability", Issued in PCT Application No. PCT/US2008/068150; Mailing Date: Jan. 14, 2010.

"International Preliminary Report on Patentability", Issued in PCT Application No. PCT/US2008/068154; Mailing Date: Jan. 14, 2010.

"Search & Examination Report", Issued in Singapore Application No. 200908539-0; Mailing Date: Mar. 18, 2011.

"Search & Examination Report", Issued in Singapore Application No. 200908528-3; Mailing Date: Feb. 15, 2011.

U.S. Appl. No. 12/145,378, filed Jun. 24, 2008.

U.S. Appl. No. 12/145,393, filed Jun. 24, 2008.

"Search and Examination Report", Issued in Singapore Application No. 200908608-3; Mailing Date: Mar. 9, 2011.

"Non Final Office Action", U.S. Appl. No. 12/145,393, Mailing Date: Feb. 16, 2012.

"Non Final Office Action", U.S. Appl. No. 12/145,378, Mailing Date: Mar. 1, 2012.

"Final Office Action", U.S. Appl. No. 12/145,393, Mailing Date: May 31, 2012.

"Final Office Action", U.S. Appl. No. 12/145,378, Mailing Date: Aug. 22, 2012.

* cited by examiner

DISTRIBUTED POWER ARRANGEMENTS FOR LOCALIZING POWER DELIVERY

PRIORITY CLAIM

This application is related to and claims priority under 35 U.S.C. §119(e) to a commonly assigned provisional patent application entitled "Distributed Power Arrangements For Localizing Power Delivery," by Neil Benjamin, Application Ser. No. 60/947,378 filed on Jun. 29, 2007, incorporated by reference herein.

BACKGROUND OF THE INVENTION

The semiconductor industry is a highly competitive market. Accordingly, the ability for an IC fabricator to minimize waste and maximize the real estate usage of a substrate may give the IC fabricator a competitive edge. Substrate processing is usually a complex process that involves many parameters. The ability to produce quality devices may depend upon an IC fabricator's ability to have highly granular control of the different processing parameters. A common cause of defective devices is the lack of uniformity during substrate processing. A factor that may impact uniformity is the distribution of power to the processing environment.

To facilitate discussion, FIG. 1A shows a simple block diagram of a simple power arrangement 100 in which a single power source is connected to a single electrode, such as an RF (radio frequency) power supply that supplies RF power to an electrostatic chuck. Traditionally the power source is located at a distance from the plasma processing system. In order to send the power from an RF (radio frequency) generator 104 to a matching network 118, the power may be sent via a transmission line 116. Usually, transmission line 116 is a 50-ohm transmission line.

With reference to FIG. 1, incoming AC power from AC line 102 may be sent to RF generator 104. Within RF generator 104, an AC-DC converter 106 may convert the incoming AC power into direct current (DC) power. Once the AC power has been converted, the DC power may be transformed by a power amplifier 110. To modulate the converted DC power, power amplifier (PA) 110 may employ filtering (114) to remove spurious noise components such as high frequency harmonics. Inside RF generator 104 may also be a controller 108, which may be employed to control the different processes that may be occurring with RF generator 104 and to interface with external control.

Metrology probe 112 may be configured at the input or output end of the transmission line, which ma be 50-ohms (typical in IC manufacturing) or 75-ohms transmission link (typical in communication), to identify the amount of power being outputted, voltage, and/or current that may be outputted.

Matching network 118 may be employed to match the output impedance of the RF generator with the impedance of the processing environment within a processing chamber 120. Matching network 118 may be configured with a metrology probe to monitor the power, voltage, and/or current in order to perform the matching. Power is usually monitored for both a capacitive and inductive environment. However, voltage is typically monitored in a capacitive environment and current is monitored in an inductive environment.

From matching network 118, RF power is transferred to processing chamber 120. In the example of FIG. 15 processing chamber 120 is an asymmetric chamber, i.e., the ground electrode has a different effective area compare to the power electrode. However, chamber 120 may be a symmetric chamber, if desired. Power may be distributed into processing chamber 120 via an upper electrode, such as a capacitive electrode 122. Processing chamber 120 and capacitive electrode 122 may form a parallel plate arrangement. Alternatively, power may be distributed into the processing chamber via a single inductive antenna 124, as shown by FIG. 1B.

Alternatively, FIG. 1C shows a simple block diagram of a simple capacitively-coupled power arrangement in which a single power source is balanced (e.g., push-pull configuration). FIG. 1D shows a similar balanced arrangement except the power arrangement is an inductive arrangement. In a balanced environment an equal area of a set of electrodes 130 (FIG. 1C) or a set of antenna 132 (FIG. 1D) has applied potential negatively and positively simultaneously. Thus, the net current to ground is zero. This arrangement may reduce problems that may be associated with ground return and may reduce sputtering that may occur in processing chamber 120.

In the power arrangements as described in FIGS. 1A, 1B, 1C, and 1D, the user has little or no control on how power may be distributed into the processing chamber except in a global fashion. In other words, the user is unable to direct different amounts of power into different regions of the processing chamber in order to control the uniformity of the plasma As a result, the configurations of the power arrangements as described in FIGS. 1A, 1B, 1C, and 1D provide the user with insufficient control over substrate processing uniformity. Also, as the chamber scales, the power arrangements, as described in the aforementioned figures, can be inefficient and/or expensive since the arrangements often require a large matching network to optimize power transfer.

To provide more control, a plurality of power arrangements as described above may be employed. However, the implementation of such an arrangement may become very expensive and complex.

FIG. 2A shows a simple diagram illustrating a multiple electrodes arrangement with a single power source. Similar to FIG. 1A, a power arrangement 200 may include an AC line 202 connected to an RF generator 204, which may include an AC-DC converter 206, a controller 208, a power amplifier 210, and a metrology probe 212. Power may be converted, modulated, and sent to a matching network 218 via a transmission line 216.

In a multiple electrode arrangement, matching network 218 tends to be a complex matching network in order to generate multiple outputs. To manage the matching network, controller 208 may also be employed, as shown by a match control path 230 between controller 208 and matching network 218. In this example, two outputs ($V_1$ and $V_2$) may be produced. An unbalanced circuit 266 may be established between matching network 218 and processing chamber 220, which may be grounded. The circuit may be unbalanced since the voltage output ($V_1$) to capacitive plate 224 may be less (e.g., smaller in amplitude) than the voltage output ($V_2$) to capacitive plate 222. To match the two voltage outputs, matching network 218 may be manipulated to alter the voltage outputs to capacitive plate 224 or to capacitive plate 222.

Alternatively, the RF power may be flowing through a pair of unbalanced inductive antenna (272 and 274), as shown in FIG. 2B. Similar to FIG. 1C, power arrangement 200 may also be implemented as a balanced push-pull arrangement in which a pair of capacitive plates (282 and 284 of FIG. 2C) or a pair of inductive antenna (292 and 294 of FIG. 2D) may be employed to create a circuit.

The power distribution arrangement of a single generator to multiple electrodes typically involves current steering (i.e., selecting whether more or less current should be at each electrode) to occur. In an example, in a balanced inductive arrangement (as that of FIG. 2D), current steering may occur between the pair of antenna to enable the current flowing across the substrate to be manipulated. However, steering the current in order to create a uniform processing environment may require a complex, bulky matching network be implemented.

In an example, in a balanced inductive environment (as shown in FIG. 2D), a complex and bulky) matching network may be required in order to accommodate a plurality of electrical components, such as transmission line straps (f1, f2, f3, and f4), to the set of antenna, for example. In order to maintain symmetry and ensure ground return, the electrical component may be shielded by an enclosure.

The aforementioned power arrangement as shown in FIGS. 2A-2D can become very complex, very complicated, and very expensive to build and maintain as the number of electrical components required to perform current steering increase. In order to determine the amount of power actually being outputted into each set of electrodes/antenna, additional components, such as metrology probes, may have to be included into the matching network, thereby causing the matching network to become even more complex/bulkier and more expensive. Because of this, the number of elements is often restricted to very few such as only one or two and consequently, highly granular control is not possible.

BRIEF SUMMARY OF THE INVENTION

The invention relates, in an embodiment, to a distributed power arrangement to provide local power deliver in a plasma processing system during substrate processing. The distributed power arrangement includes a set of direct current (DC) power supply units. The distributed power arrangement also includes a plurality of power generators, which is configured to receive power from the set of DC power supply units. Each power generator of the plurality of power generators is coupled to a set of electrical elements, thereby enabling the each power generator of the plurality, of power generators to control the local power delivery.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1A:
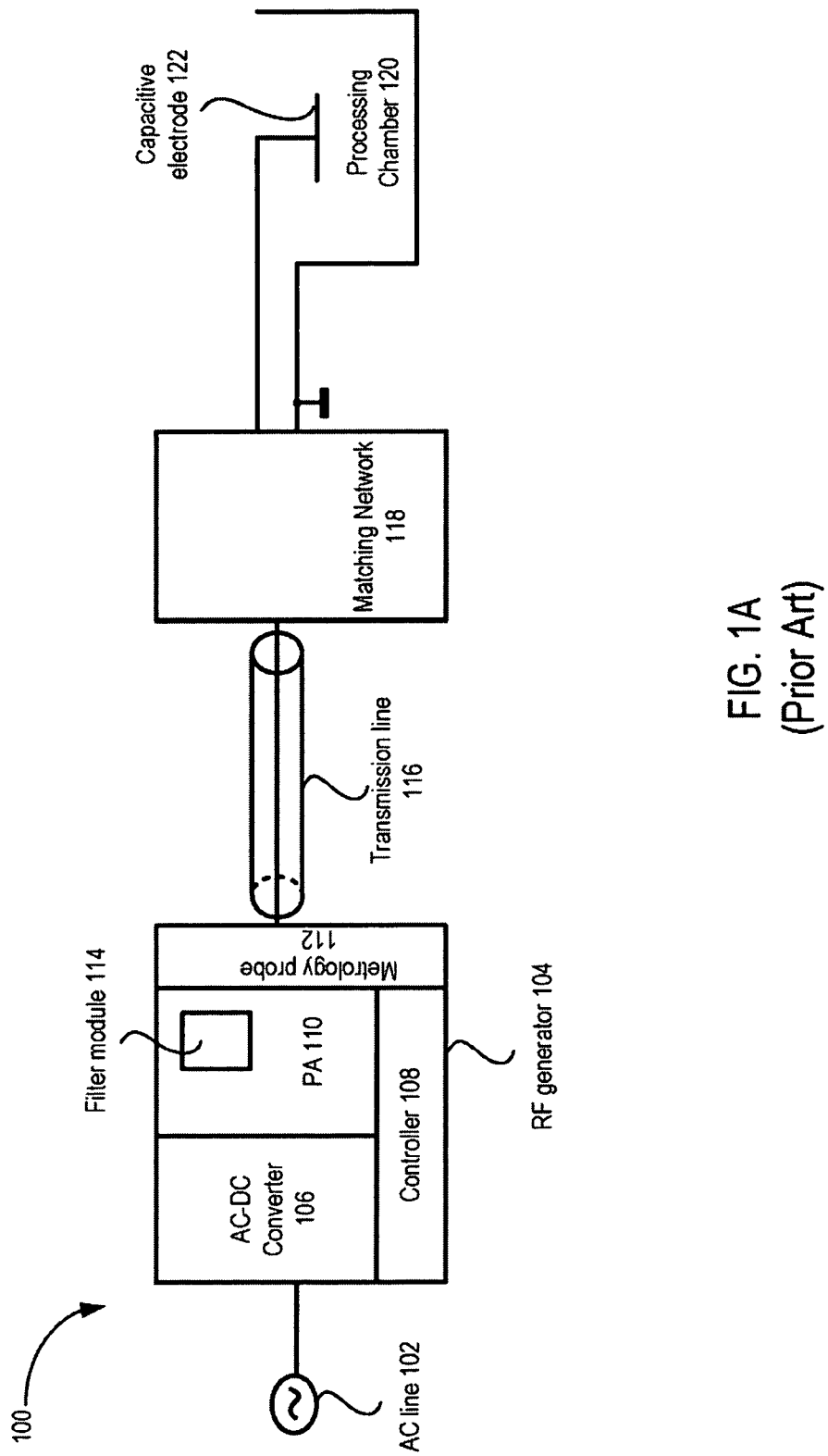
FIG. 1A shows a simple block diagram of a simple power arrangement in which a single power source is connected to a single-ended electrode.
Figure 1B:
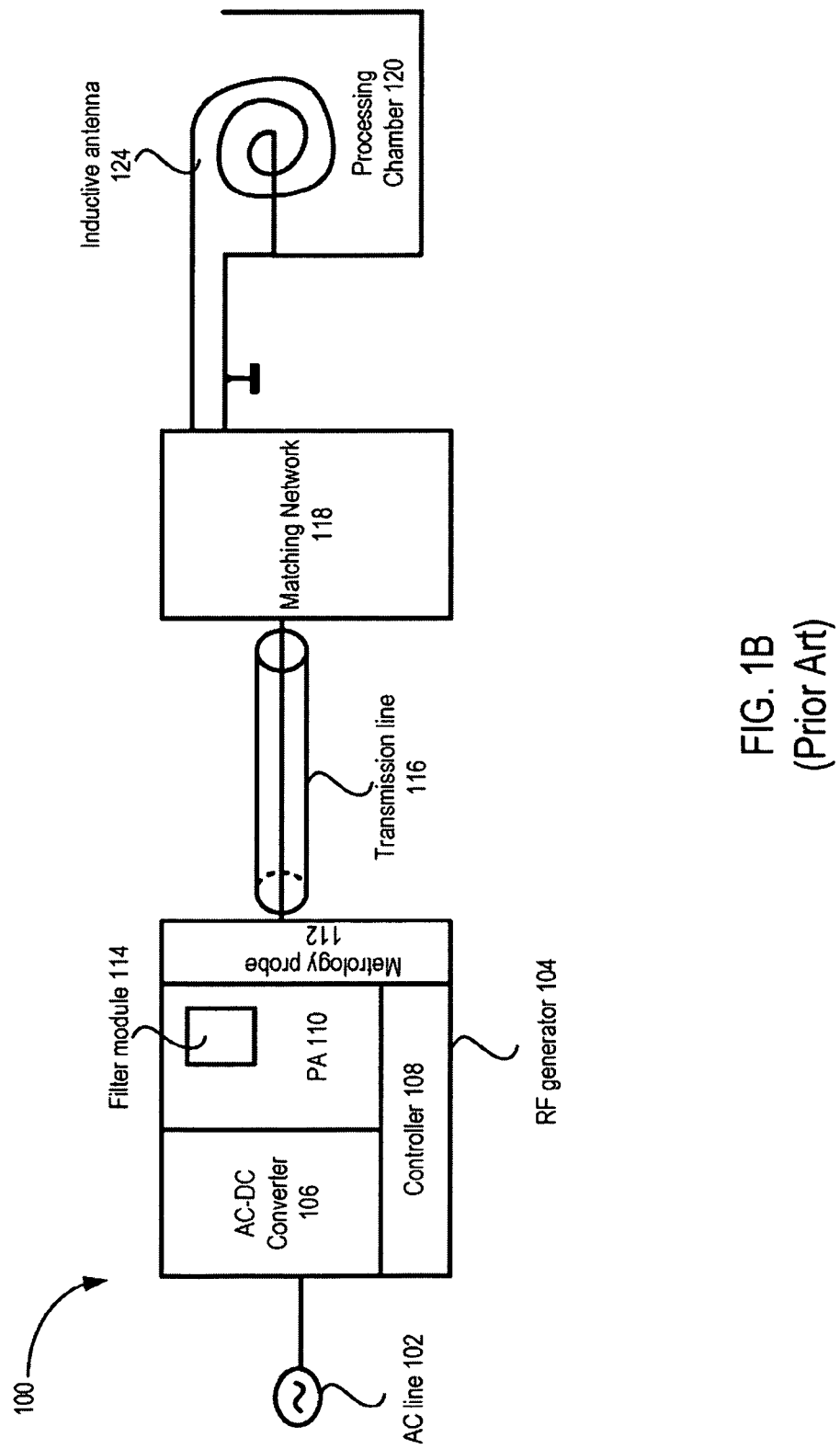
FIG. 1B shows a simple block diagram of a simple power arrangement in which a single power source is connected to a singled-ended antenna.
Figure 1C:
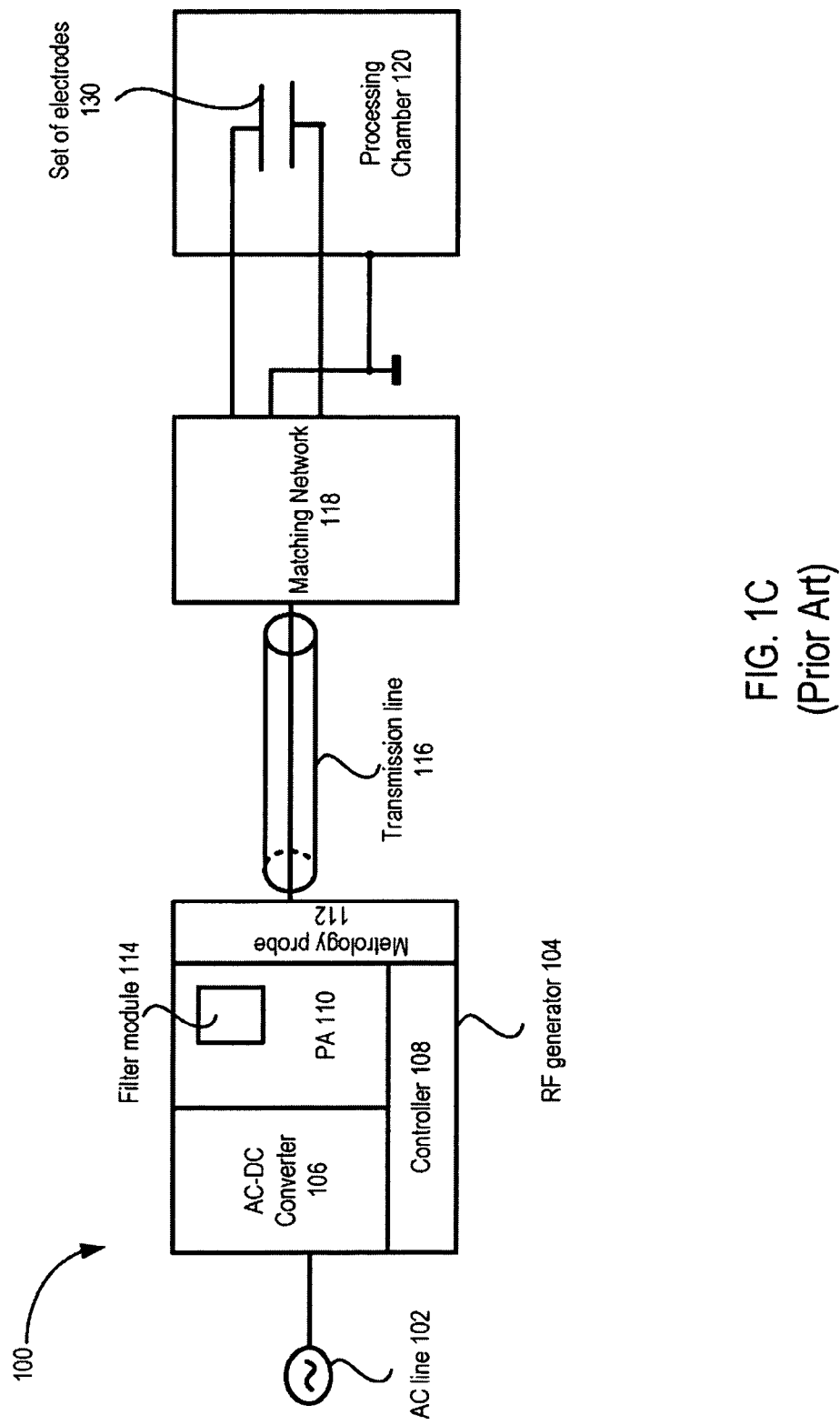
FIG. 1C shows a simple block diagram of a simple power arrangement in which a single power source is connected to a balanced pair of electrodes.
Figure 1D:
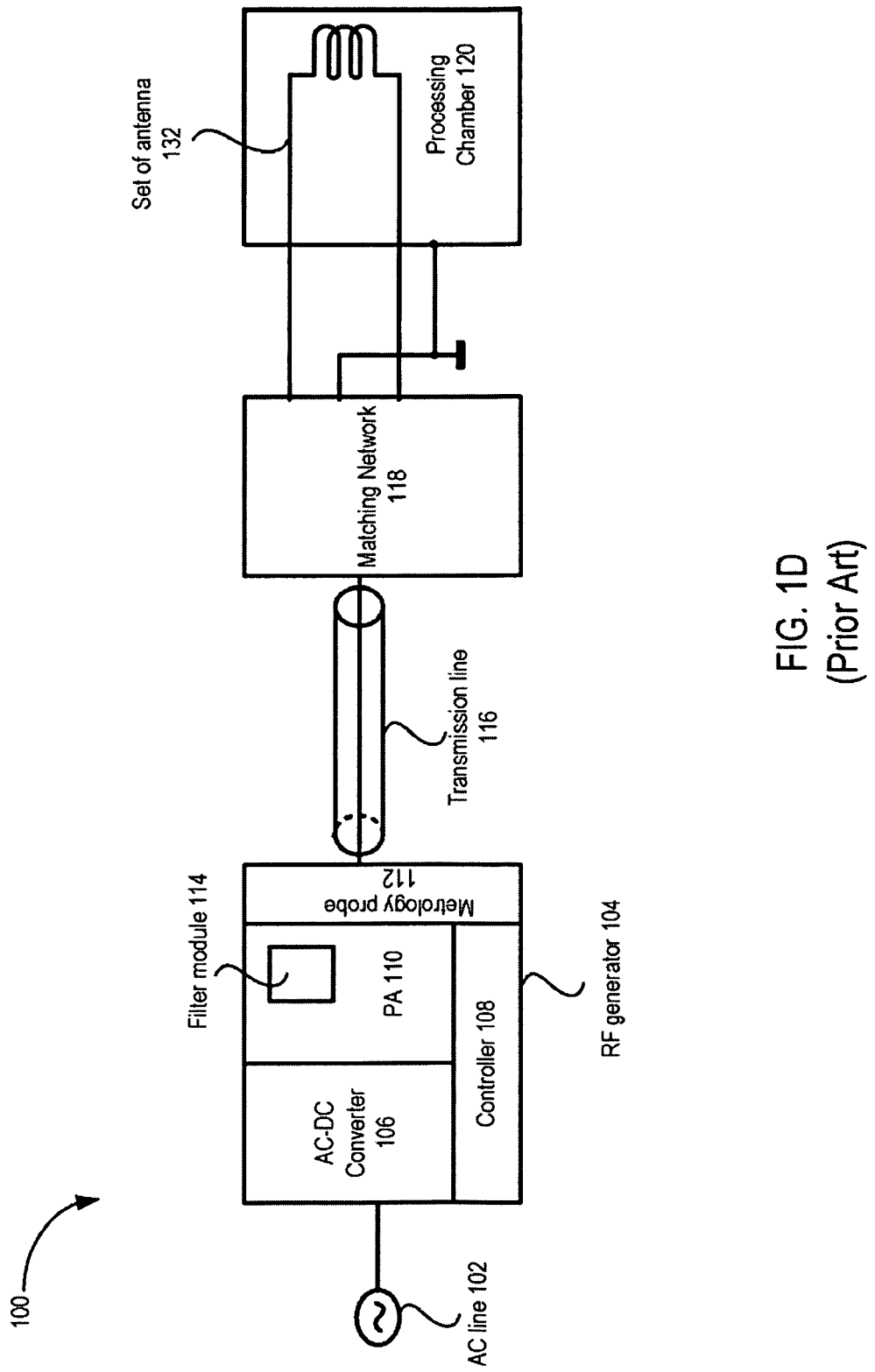
FIG. 1D shows a simple block diagram of a simple power arrangement in which a single power source is connected to a balanced pair of antenna.
Figure 2A:
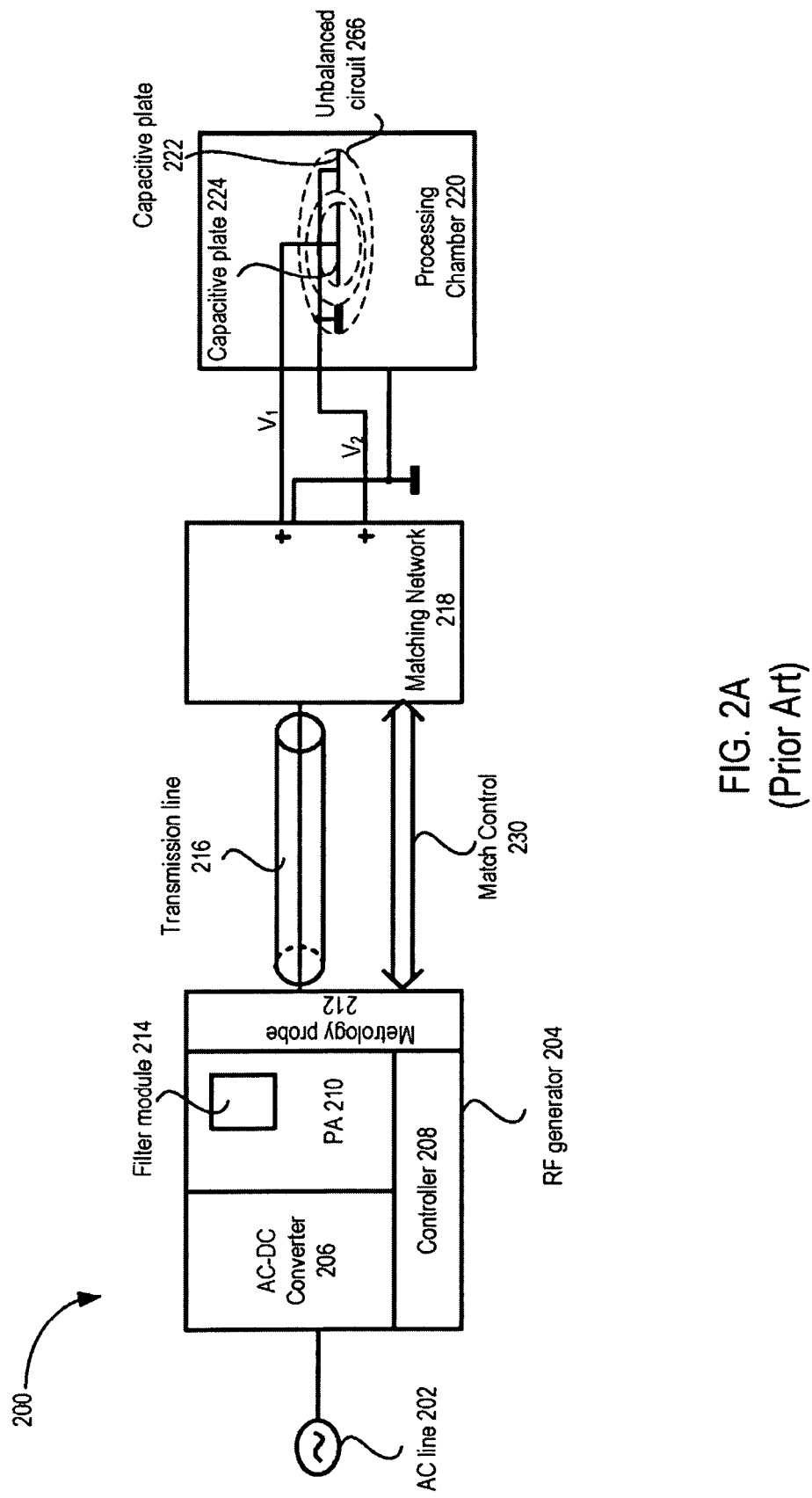
FIG. 2A shows a simple diagram illustrating a multiple electrodes arrangement with a single power source.
Figure 2B:
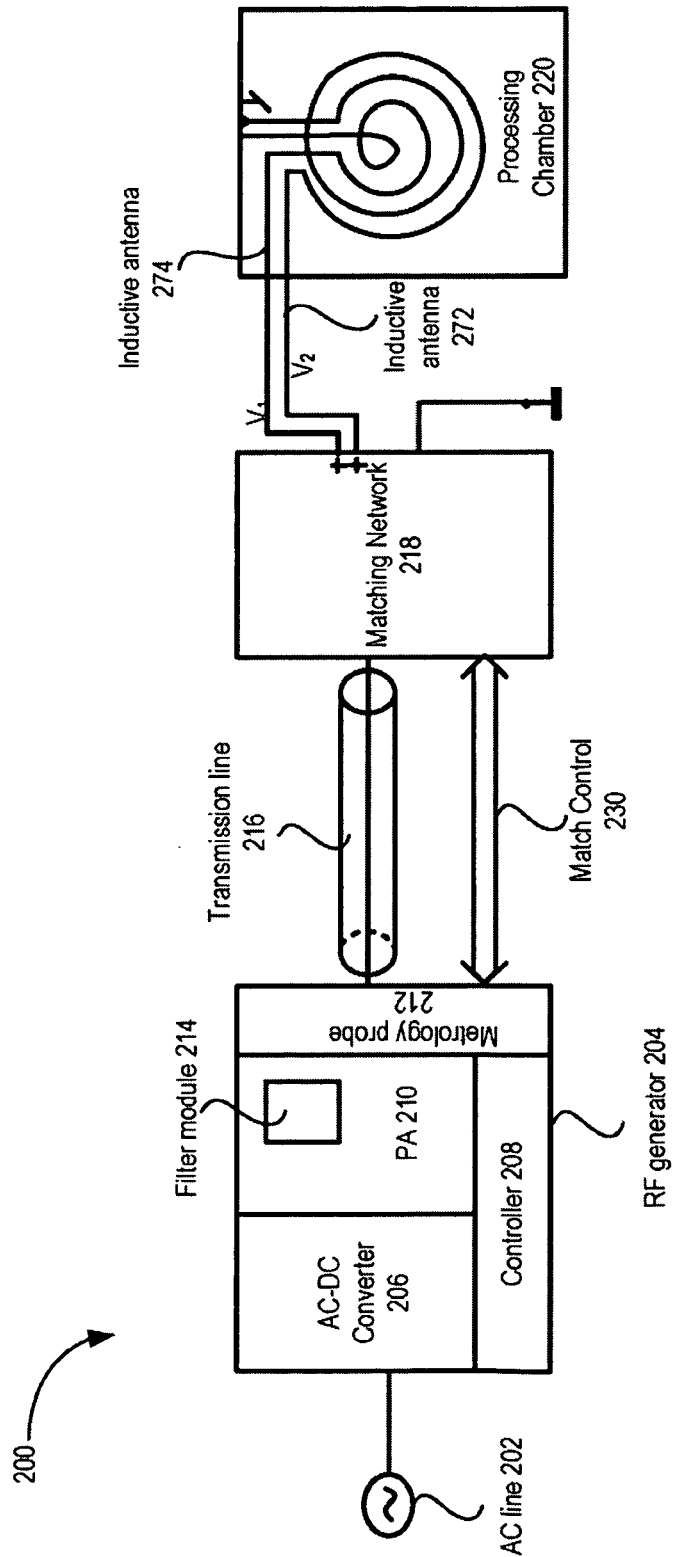
FIG. 2B shows a simple diagram illustrating a multiple antenna arrangement with a single power source.
Figure 2C:
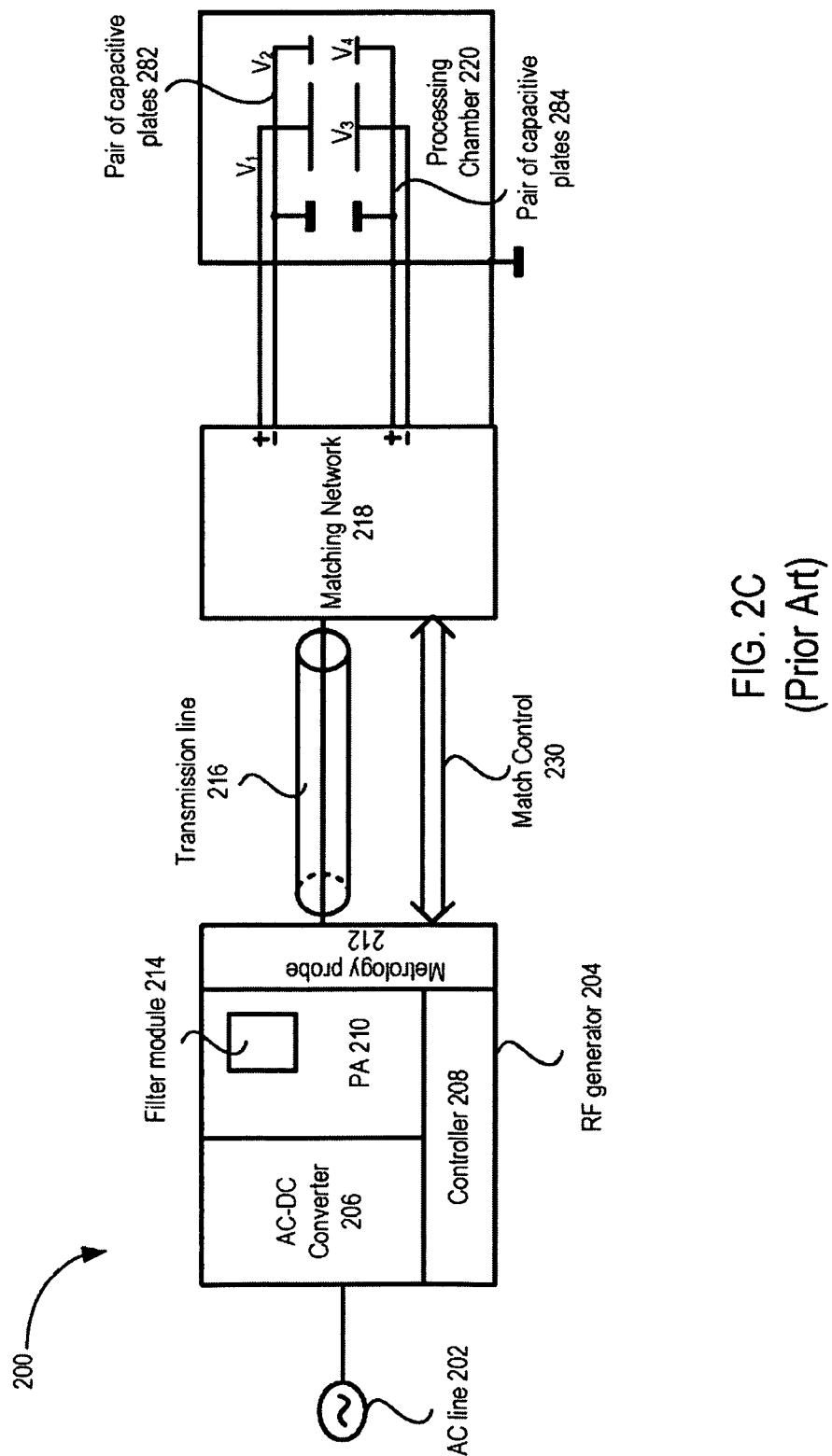
FIG. 2C shows a simple diagram illustrating a balanced multiple electrodes arrangement with a single power source.
Figure 2D:
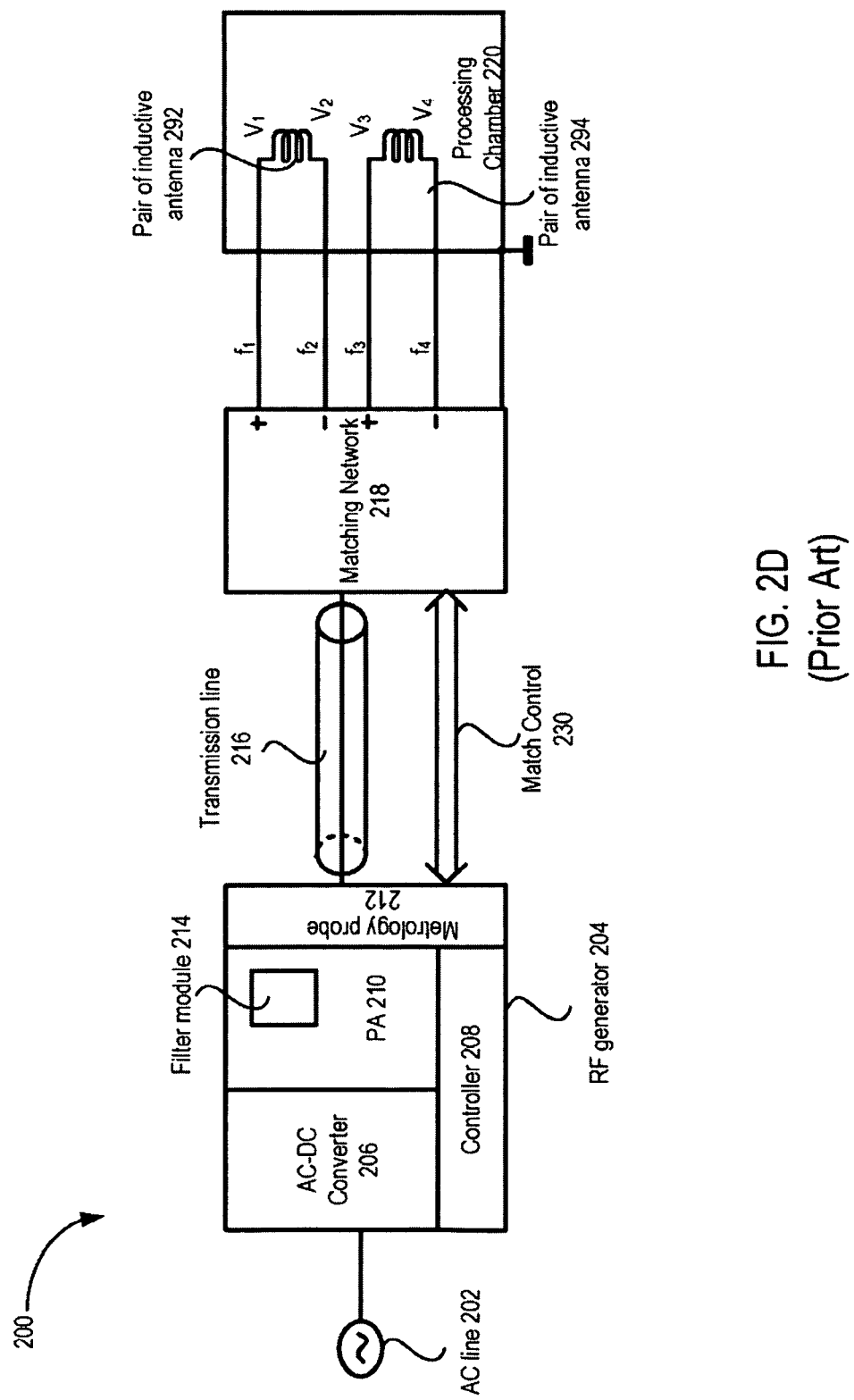
FIG. 2D shows a simple diagram illustrating a balanced multiple antenna arrangement with a single power source.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In one aspect of the invention, the inventor herein realized that local control of power delivery is needed in order to achieve more uniform processing. The inventor realized that a critical factor that may impact the uniformity of the plasma being generated to process a substrate may be the amount of power being delivered into specific regions of the processing chamber. In the prior art controlling power delivery to a specific region of the processing chamber may be difficult given a single power source. Even if local power delivery may be possible, the mechanism for controlling the local power delivery tends to be difficult and expensive to engineer, especially when power has to be delivered to a large array of capacitive/inductive elements from a single RF generator. In accordance with embodiments of the invention, a distributed power arrangement is provided for performing local power delivery and control thereof. Embodiments of the invention include a plurality of local power (e.g., RF) generators being mounted locally or very close to at each set of electrodes/antenna to enable local power delivery. The local RF generator may be remote and power may be transmitted through the chamber, via a transmission line, if desired.

In this document, various implementations may be discussed using RF as an example. This invention, however, is not limited to RF and may include any type of power (e.g., microwave power). Instead, the discussions are meant as examples and the invention is not limited by the examples presented.

In the prior art, a single power generator may be employed to distribute power to the capacitive/inductive elements of the processing system. Unlike the prior art, a plurality of power generators (greater than two, such as three, four, etc.) may be employed to distribute power to a set of capacitive/inductive elements, in an embodiment. As the term is employed herein, the plurality of power generators denotes the number of power generators being greater than two (such as three, four, etc.). In yet another embodiment, the plurality of power generators may be distributed closer to the processing chamber in order to minimize power loss and each matching consideration as the power is transmitted from the power generators to each capacitive/inductive element. In other words, instead of having the power generator being transmitted over a transmission line and a matching network (such as previously described in the prior art), the plurality of power generators may be directly coupled (via optional match network, which is preferably a simple fixed match network) to the set of capacitive/inductive elements, which are positioned within the processing chamber.

In an embodiment, the power to each local power (e.g., RF) generator may be provided by a direct current (DC) power supply unit. In an embodiment, the DC power supply unit may distribute the power to each local power (e.g., RF) generator along a common rail. In another embodiment, the DC power supply unit may also be distributed locally to each power amplifier with power control performed locally at the local power amplifier. In an example, each local RF generator may be paired up with a separate DC power supply unit. By distributing the DC power supply unit, a method for control is provided to manipulate the amount of power being distributed to each local RF generator.

In an embodiment, a power amplifier (PA) module (such as an RF power amplifier module) may be employed within each local power (e.g., RF) generator to accept and transform the incoming DC power. Since the power is being locally distributed, the amount of power distributed to each local power (e.g. RF) generator ma) be significantly less than that of the prior art RF generator.

To match the input impedance of the processing chamber with the output impedance of the local power (e.g., RF) generator, a match component or components may be employed. In an embodiment, the match component may be a fixed match component that may be capable of implementing different matching techniques, including but are not limited to, variable frequency, electronic switching and reflection absorption. Since the matching component is only required to support a fraction of the total power and in order to minimize complexity and cost, simple match arrangement, each with a few simple fixed elements, are preferable. The matching component ma; be fairly compact with minimal engineering requirements.

Since the power load has been distributed among many local power generators, the engineering of the local power generators may be significantly less complex and less expensive to produce. Further, each local power generator can be built as a modularized unit such that each local power generator has the same configuration. In other words, if a local power generator has to be replaced, the technician may quickly remove the old local power generator and replace it with a new modularized unit.

In an embodiment of the invention, a local controller, which is located within each local power generator, may interact with a main controller. The interaction enables the main controller to monitor the local power generators and send instructions to the local controllers, as needed. In an example, status data about each local power generator may be transmitted to the main controller, which may monitor the incoming data for anomaly. Further, the main controller may be employed to synchronize the distributed local power generators, as needed, and facilitate the execution of a desired power distribution pattern to the chamber.

The features and advantages of the present invention may be better understood with reference to the figures and discussions that follow.

Figure 3A:
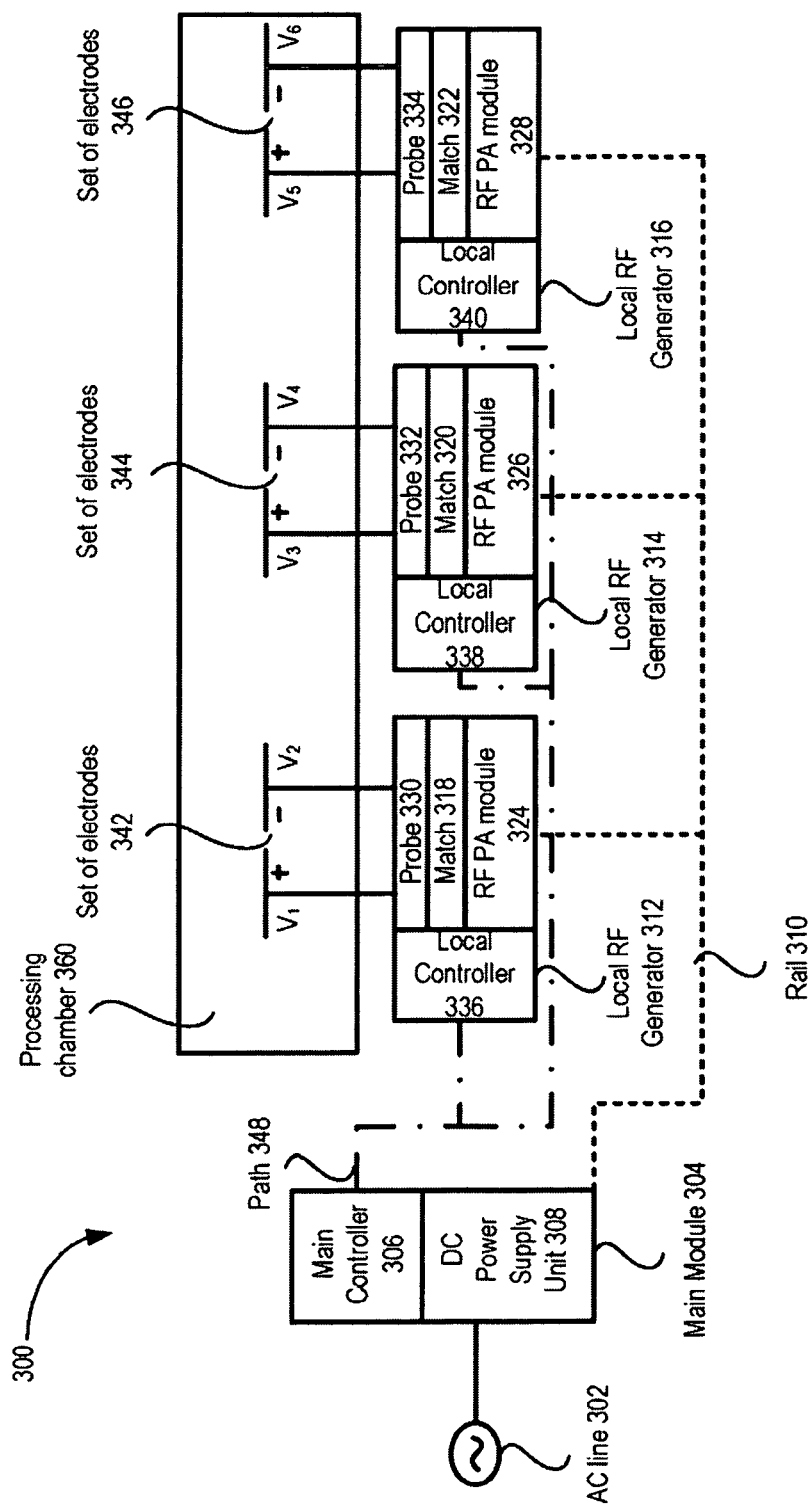
FIGS. 3A and 3B show, in embodiments of the invention, a distributed RF arrangement in which the power amplifier (e.g., RF delivery) has been distributed.

FIG. 3A shows, in an embodiment of the invention, a distributed power arrangement in which the power amplifier has been distributed. In a distributed power arrangement 300, an AC line 302 is connected to a main module 304. Main module 304 may include a main controller 306 and a DC power supply unit 308. Main controller 306 may interact with the plasma processing system in order to retrieve information about processing progress, recipe, and the like.

DC power supply unit 308 may include an AC-DC converter to convert the incoming AC power into DC power. Note that the incoming power is not limited to AC power and may include other type of power, including DC power (in which case AC conversion is not necessary). Power is distributed from DC power supply unit 308 along a rail 310 to the various local RF generators (312, 314, and 316).

In an embodiment, the DC power supply unit may be distributed locally. In other words, instead of a single DC power supply unit located at the main module, a plurality of DC power supply units may be distributed locally near the inductive and/or capacitive elements that require the power. Being smaller and less complex, thus distribution is possible. In an embodiment, a DC power supply unit may be located within each local RF generator. In another embodiment, a DC power supply unit may be located near each local RF generator. By distributing the DC power supply unit, better control over the local RF power delivery may be achieved since each local RF power delivery may now be independently controlled. In other words, by distributing the DC power supply unit, the amount of DC voltage being distributed to each of the power amplifier may be less, rendering it simpler to have the power controlled and managed. DC regulation may also be performed alternatively or additionally at the local RF power supplies.

Figure 3B:
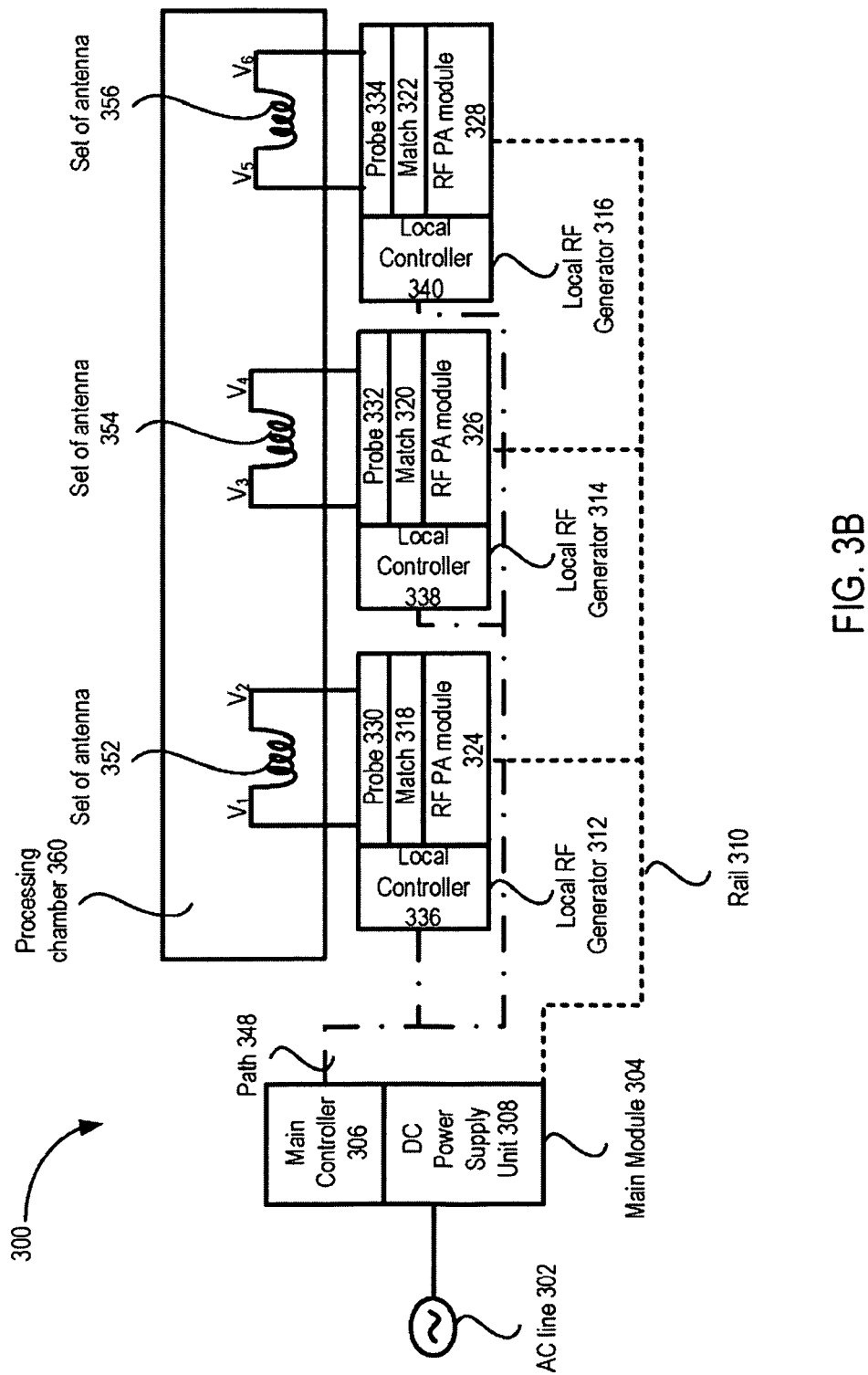

As aforementioned, a plurality of local RF generators may be employed to distribute the power to the plurality of set of electrodes. In an embodiment, each local RF generator may be providing power to one set of electrodes (e.g., set of electrodes 342, set of electrodes 344, and set of electrodes 346) in a capacitive environment. Alternatively, in an inductive environment, each local RF generator may be providing power to a set of antenna (e.g., 352, 354, and/or 356), as shown in FIG. 3B.

Since RF delivery is distributed, each local RF generator may have a significantly smaller dimension and/or less complex and/or cheaper to produce than an RF generator of the prior art. The number of local RF generators that may be implemented may depend upon the requirements of the user. The larger number of RF generators also benefit from economy of scale from a cost standpoint and the low cost of each makes them readily available for replacement, thereby improving overall system reliability.

Each local RF generator may include an RF power amplifier (PA) module (e.g., RF PA module 324, RF PA module 326, and RF PA module 328). Unlike the prior art, the amount of power being distributed locally may be significantly less than the prior art since the power is being distributed by many local RF generators. In an example, a typical prior art RF generator may generate 3 kilowatts of power whereas a local RF generator may only need to generate about 200-300 watts of power. Since the amount of power at each local RF generator has been significantly reduced, the engineering of the local RF generator may, be simplified. In an example, an enclosure to shield the power supply may be substantially eliminated or made simpler/more compact/cheaper since the power being delivered is substantially less than the power being delivered by the prior art RF generator.

As mentioned, each local RF generator may include a match component (e.g., match 318, match 320, match 322, etc.) in order to at least partially match the input impedance of a processing chamber 360 with the output impedance of the local RF generator, in an embodiment. In the prior art, the matching network can be bulky and complex in order to accommodate the complex geometry of the variable capacitive/inductive elements to provide power to the various electrodes.

In an embodiment, the match component may be a fixed match. The fixed match may enable the user to preset different ranges when the plasma system may have a plurality of variable components. In an embodiment, the match component may be a fixed match component that may be used with different matching techniques, including but are not limited to, variable frequencies, electronic switching, power absorption, reflection absorption, and the like. The different types of matching techniques that may be employed are known in the art and no further discussion will be provided.

One or more local RF generators may also include a probe (e.g., probe 330, probe 332, and probe 334). In an embodiment, the probe may be employed to measure the voltage, current, phase, etc. to derive the amount of power being transmitted to the set of electrodes. These measured and/or derived values (power, impedance, etc.) may be used as controlled parameters to enable a control scheme to control the power distribution in the chamber as desired. The data from the probe may be employed by the match component to manage impedance differences between the processing chamber and the RF generator. The implementation of a probe is especially useful in performing calibration when reflectance results in power loss.

Each local RF generator may also include a local controller (e.g., local controller 336, local controller 338, and local controller 340). Each local controller may interact with main controller 306 via, for example, a path 348. In an example, main controller 306 may send instructions to each local controller. Instructions may include, but are not limited to, conditions for turning on a local RF generator, conditions for turning off the local RF generator, pulsing the level of power, voltage, or current generated, and the like. In an embodiment, main controller 306 may send out synchronization signals to the local controllers in order to create a uniform processing environment among the local RF generators.

As can be appreciated from the foregoing, the distributed RF arrangement provides a method and system for performing RF delivery locally. Since each local RF generator may be locally mounted, the requirement for a transmission line may be substantially eliminated, in an embodiment.

With a local RF generator, the amount of power, voltage, or current being distributed to each set of electrodes or antenna may be tightly controlled, thereby providing more local control over substrate processing. Consider the situation wherein, for example, a substrate is being processed. Typically, during processing with the prior art RF generator, the plasma may be non-uniform across the substrate. Therefore, processing results may be non-uniform. With a local RF generator, the amount of power being distributed to each set of electrodes or antenna may be individually controlled. Thus, more power may be distributed to set of electrodes 342 (which deliver power to the edge of a substrate) and less to others in order to create more uniform plasma, if that is desired.

Thus, with local control, amount of power may be adjusted locally to handle incoming non-uniform substrate (especially those previously identified through techniques such as lithography). In an example, by employing local compensation, the etch process may be varied to account for the non-uniform topography of the substrate, thereby resulting in a more uniform outgoing substrate.

In an embodiment, main controller 306 is configured to run diagnostics on the distributed RF generators through the local controllers. Consider the situation wherein, for example, local controllers are sending status data about the local RF generators to main controller 306. In an embodiment, criteria may be preset to identify potential problems. In an example, main controller 306 is configured to monitor the matching conditions within each local RF generator. If the matching conditions fall outside of an acceptable range, main controller 306 may send an alert to the operator. Since the local RF generator can be built as a modularized unit, minimal time and resources will be required to replace a non-functioning RF generator. Self-diagnostic may be provided to pinpoint which of the multiple local RF supplies need to be maintained/replaced before the problem occurs.

Figure 4:
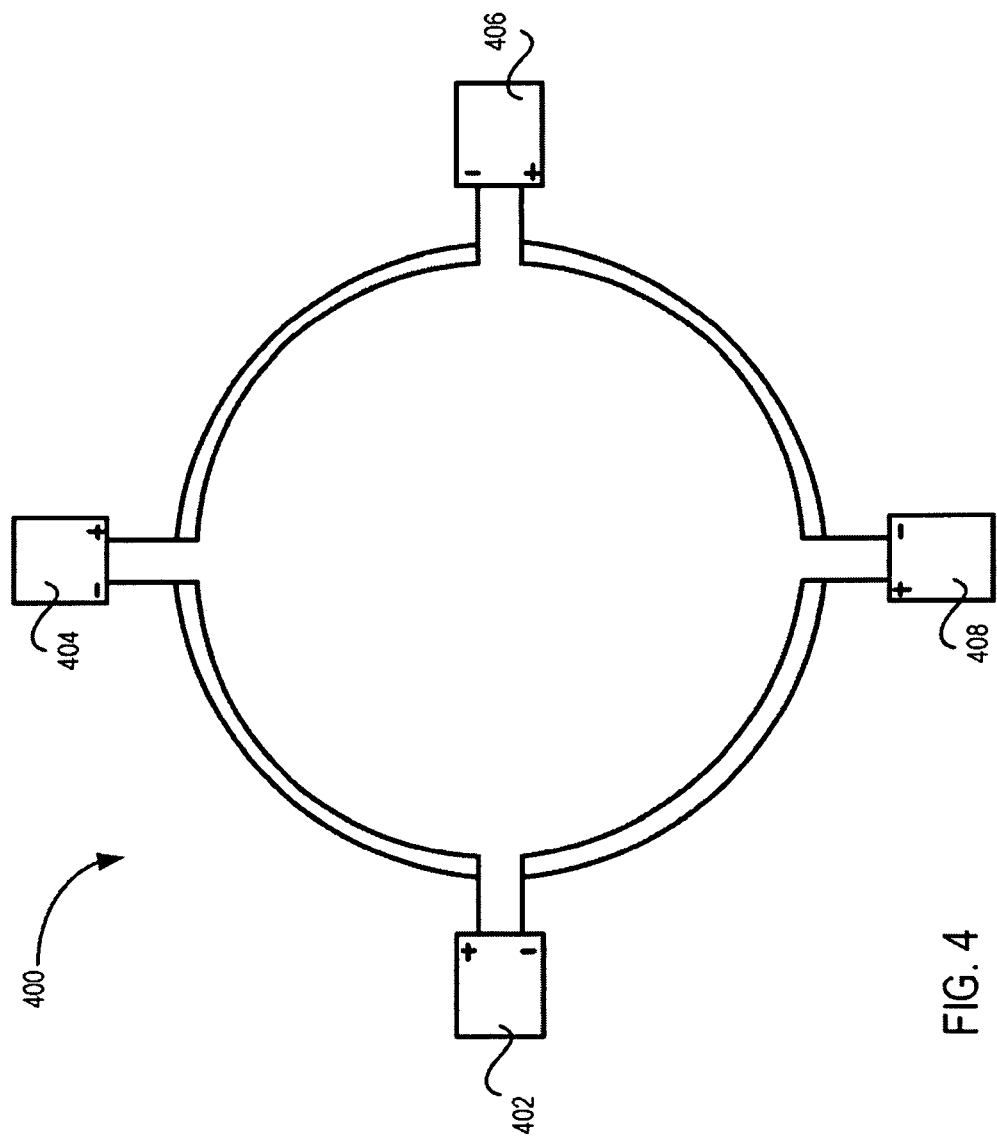
FIG. 4 shows, in an embodiment of the invention, a distributed integrated RF arrangement network.

The aforementioned embodiments described local RF deliver based on a distributed RF arrangement with discrete capacitive/inductive elements. However, local RF delivery may also be implemented in a network arrangement. FIG. 4 shows, in an embodiment of the invention, a distributed integrated power (e.g., RF) arrangement network 400. Distributed integrated RF arrangement network 400 may include a network of straps, which may be powered at each node.

The configuration of the distributed integrated power (e.g., RF) arrangement network may include, but are not limited to, a hexagonal close pack, a concentric circle, a rectilinear arrangement, and the like. Consider the situation w % herein, for example, distributed integrated RF arrangement network 400 is configured as a segmented concentric circle. A local RF generator is located at each node (402, 404, 406, and 408). Distributed integrated RF arrangement network 400 may provide local power control to a distributed array of nodes within a network.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A distributed power arrangement to provide local power delivery in a plasma processing system during substrate processing, comprising:
 a single direct current (DC) power supply;
 a common rail arrangement coupled to the DC power supply; and
 a plurality of power generators coupled to a single chamber, said plurality of power generators being configured to receive power from said single DC power supply via the common rail arrangement, wherein each power generator of said plurality of power generators being coupled to a set of electrical elements,
 each power generator of said plurality of power generators to be at different locations in relation to others of said plurality of power generators during said substrate processing and to control said local power delivery to said each power generator of said plurality of power generators at said different locations, further wherein said each power generator of said plurality of power generators is a modularized unit, said each power generator including a power amplifier module, a match impedance component, a probe, and a local controller,
 a main controller, said main controller being configured to interact with said plasma processing system, said local controller that is located within said each power generator of said plurality of power generators, said local controller being configured to interact with said main controller,
 wherein interaction includes receiving instructions from said main controller, said main controller is configured to monitor status for said each power generator by receiving status data from said local controller associated with said each power generator.

2. The distributed power arrangement of claim 1 wherein said plurality of power generators is a plurality of radio frequency (RF) generators.

3. The distributed power arrangement of claim 1 wherein said plurality of power generators is a plurality of microwave generators.

4. The distributed power arrangement of claim 1, wherein said match impedance component being configured to match impedance within said each power generator with impedance of a processing chamber of said plasma processing system.

5. The distributed power arrangement of claim 4 wherein said match impedance component is configured to perform different matching techniques, including variable frequencies and electronic switching.

6. The distributed power arrangement of claim 1 wherein said probe is configured to at least measure said local power delivery to said set of electrical elements.

7. The distributed power arrangement of claim 6 wherein said set of electrical elements being a set of electrodes.

8. The distributed power arrangement of claim 6 wherein said set of electrical elements being a set of antenna.

9. The distributed power arrangement of claim 1 wherein said plurality of power generators is configured to enable local power control to a distributed array of nodes within a network.

10. The distributed power arrangement of claim 9 wherein said plurality of power generators is configured as a segmented concentric circle, wherein a power generator is positioned at each node of said distributed array of nodes.

11. The distributed power arrangement of claim 9 wherein said plurality of power generators is configured as a rectilinear arrangement, wherein a power generator is positioned at each node of said distributed array of nodes.

12. The distributed power arrangement of claim 1, wherein each power generator is configured to locally generate less than 300 watts of power.

13. The distributed power arrangement of claim 1, wherein the main controller is configured to send instructions to the local controller of the plurality of power generators to cause one or more of the plurality of power generators to turn on or off, or to pulse a level of power, or to synchronize, or to run diagnostics, or to monitor matching conditions, or to send alerts.

14. The distributed power arrangement of claim 1, wherein an RF power transmission line is not provided between the power supply and each of the plurality of power generators.

15. A distributed power system to provide local power delivery in a plasma processing system during substrate processing, comprising:
 a power supply source;
 a plurality of power generators;
 a common rail arrangement coupling the power supply source to each of the plurality of power generators;
 a main controller configured for interacting with said plasma processing system, wherein the main controller is separately located away from the plurality of power generators; and
 said plurality of power generators being coupled to a single chamber and configured to receive said power from said power supply source, wherein each power generator of said plurality of power generators being coupled to a set of electrical elements,
 each power generator of said plurality of power generators to be at different locations in relation to others of said plurality of power generators during said substrate processing and to control power delivery to said each power generator of said plurality of power generators at said different locations;
 wherein said each power generator of said plurality of power generators is a modularized unit, said each power generator including a power amplifier module, a match impedance component, a probe, and a local controller,
 wherein said power amplifier module is employed by said power generator of said plurality of power generators to at least accept and transform said power from said power supply source;
 wherein said match impedance component is employed by said power generator of said plurality of power generators to at least match impedance within said each power generator with impedance of the single chamber of said plasma processing system;
 wherein said probe is coupled to said each power generator of said plurality of power generators, said probe usable to measure said local power delivery power to said set of electrical elements; and
 wherein said local controller is employed by said each power generator to at least interact with said main controller, wherein interaction includes at least receiving instructions from said main controller.

16. The distributed power arrangement of claim wherein said set of electrical elements being a set of antenna.

17. The distributed power system of claim 15, wherein each power generator of said plurality of power generators generate less than about 300 watts.

18. The distributed power system of claim 15, wherein the main controller is configured to send instructions to the local controller of the plurality of power generators to cause one or more of the plurality of power generators to turn on or off, or to pulse a level of power, or to synchronize, or to run diagnostics, or to monitor matching conditions, or to send alerts.

19. The distributed power system of claim 15, wherein an RF power transmission line is not provided between the power supply source and each of the plurality of power generators.

20. A distributed power arrangement to provide local power delivery in a plasma processing system during substrate processing, comprising:

a set of direct current (DC) power supply units; and a plurality of power generators, said plurality of power generators coupled to a single chamber and being configured to receive power from said set of DC power supply units, wherein a DC power supply unit of said set of DC power supply unit is located within said each power generator of said plurality of power generators, wherein each power generator of said plurality of power generators being coupled to a set of electrical elements, each power generator of said plurality of power generators to control amount of said local power delivery to the set of electrical elements, further wherein said each power generator of said plurality of power generators is a modularized unit, said each power generator including a power amplifier module, a match impedance component, a probe, and a local controller wherein each one of said modularized units is replaceable relative to other ones of said plurality of modularized units and being replaceable relative to said plasma processing system, further including, a main controller, said main controller being configured to interact with said plasma processing system, said local controller is located within said each power generator of said plurality of power generators, said local controller being configured to interact with said main controller, wherein interaction includes receiving instructions from said main controller, said main controller is configured to monitor status for said each power generator by receiving status data from said local controller associated with said each power generator, wherein the status data is used to independently identify a condition of each of the plurality of power generators.

21. The distributed power arrangement of claim 20, wherein each power generator is configured to locally generate less than 300 watts of power.

22. The distributed power arrangement of claim 20, wherein the main controller is configured to send instructions to the local controller of the plurality of power generators to cause one or more of the plurality of power generators to turn on or off, or to pulse a level of power, or to synchronize, or to run diagnostics, or to monitor matching conditions, or to send alerts.

23. The distributed power arrangement of claim 20, wherein an RF power transmission line is not connected between the main controller and each of the plurality of power generators.

\* \* \* \* \*